United States Patent [19]

Wehrly, Jr. et al.

[11] Patent Number: 4,945,954
[45] Date of Patent: Aug. 7, 1990

[54] METHOD AND APPARATUS FOR ALIGNING MATING FORM TOOLS

[75] Inventors: James D. Wehrly, Jr.; Michael J. Bertram, both of Austin, Tex.

[73] Assignee: Microelectronics and Computer Technology Corporation, Austin, Tex.

[21] Appl. No.: 414,549

[22] Filed: Sep. 28, 1989

[51] Int. Cl.⁵ .................................... B21D 37/12
[52] U.S. Cl. .................................. 140/105; 72/456; 83/637
[58] Field of Search ............... 140/105; 72/456; 83/637

[56] References Cited

U.S. PATENT DOCUMENTS

| | | | |
|---|---|---|---|
| 2,997,907 | 8/1961 | Constantino | 83/637 |
| 3,417,643 | 12/1968 | Bennett | 83/637 |
| 4,064,917 | 12/1977 | Diaz | 140/105 |
| 4,361,173 | 11/1982 | Storimans | 140/1 |
| 4,371,012 | 2/1983 | Weresch | 140/105 |
| 4,488,581 | 12/1984 | Stumpf et al. | 140/147 |
| 4,559,978 | 12/1985 | Glatzel | 140/147 |
| 4,625,772 | 12/1986 | Maskens | 140/105 |
| 4,633,920 | 1/1987 | Donovan et al. | 140/105 |
| 4,691,747 | 9/1987 | Sokolovsky | 140/147 |
| 4,787,426 | 11/1988 | Linker et al. | 140/147 |

Primary Examiner—Lowell A. Larson
Attorney, Agent, or Firm—David M. Sigmond

[57] ABSTRACT

A method and apparatus for aligning two mating tools is provided by a plurality of alignment members extending upward from the surface of one mating tool so that the alignment members engage in slidable contact with alignment tracks formed in the edges of the second mating tool. The alignment members and tracks can be formed in the four corners of rectangular mating tools, and the alignment members can be cylindrical rods with dome shaped tops. The alignment is useful both for tooling set-up as well as tooling usage. The alignment means can be used on a punch and lead form anvil for forming the outer leads of an integrated circuit bonded to a TAB tape.

20 Claims, 4 Drawing Sheets

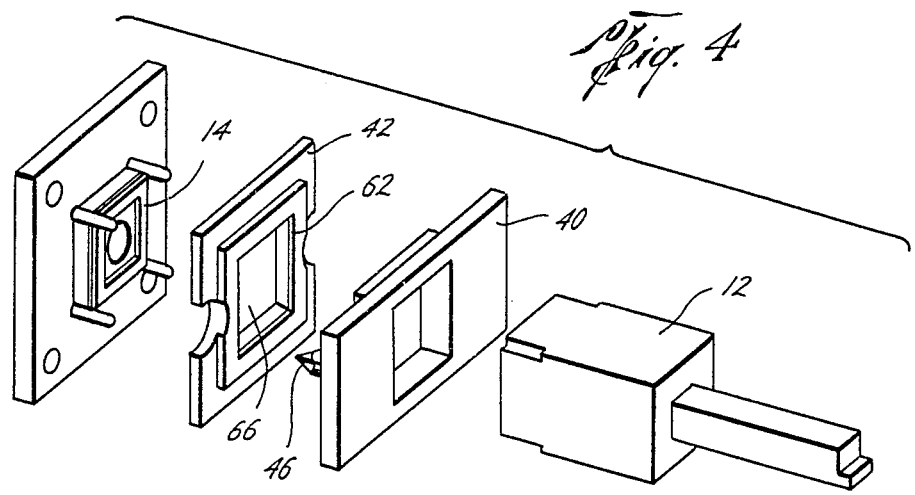
Fig. 4
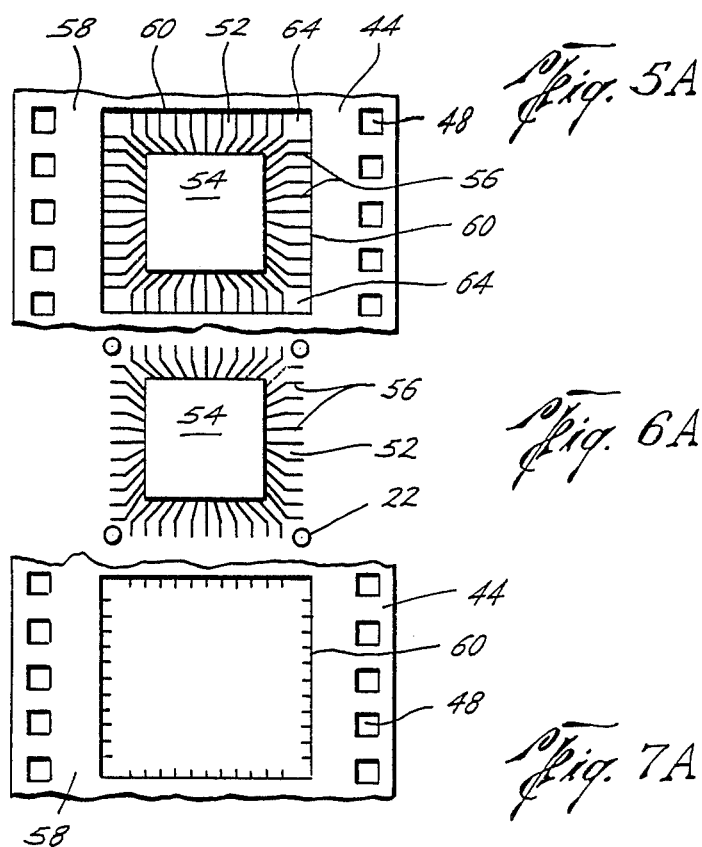
Fig. 5A
Fig. 6A
Fig. 7A

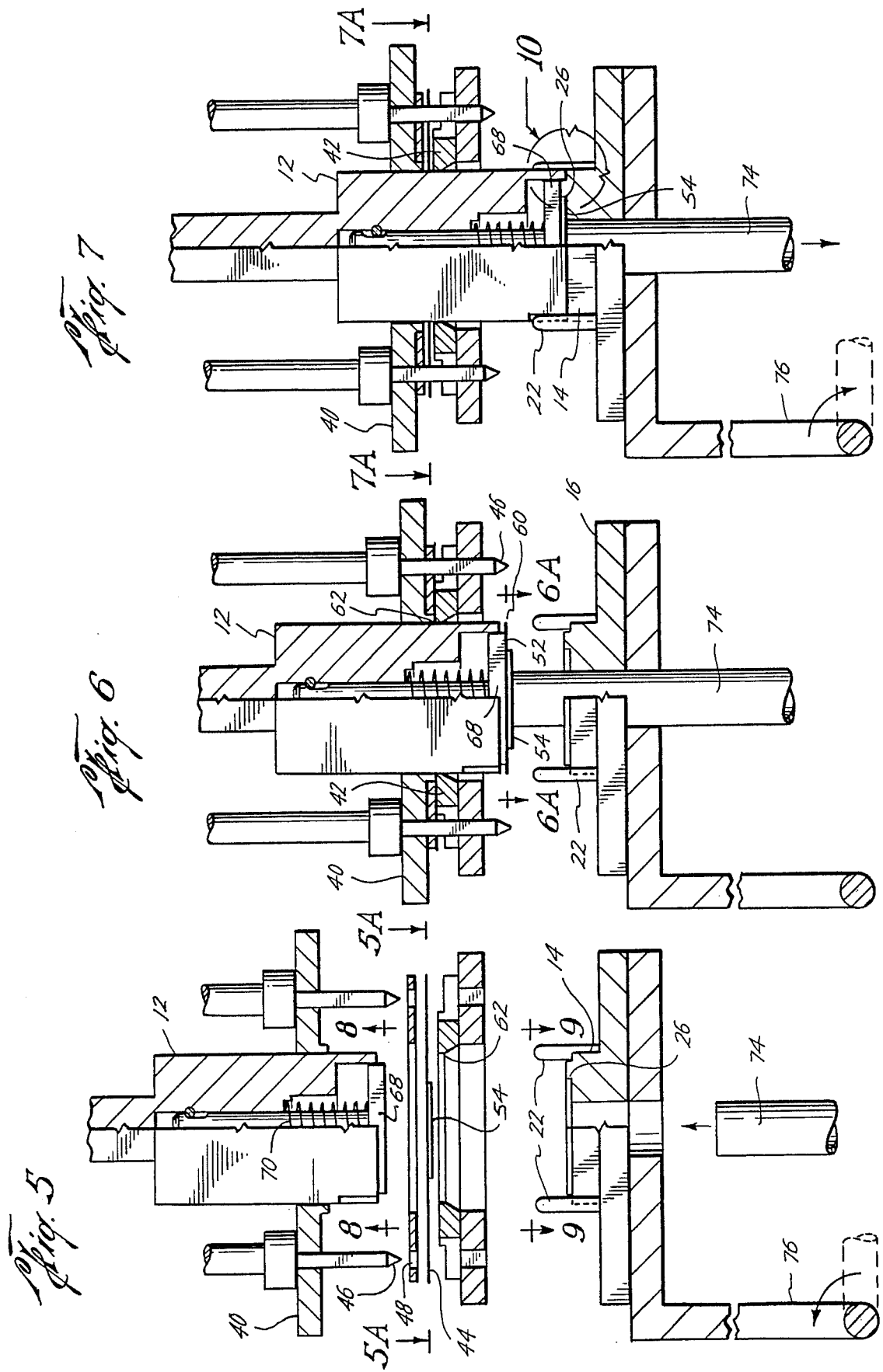

METHOD AND APPARATUS FOR ALIGNING MATING FORM TOOLS

BACKGROUND OF THE INVENTION

The present invention relates to the alignment of mating form tools, and more particularly to the alignment of a punch and lead form anvil to form the outer leads of an integrated circuit (I.C.) chip mounted on a tape automated bonding (TAB) tape.

The use of alignment pins for excising an I.C. chip and its extending outer leads from a tape segment and then forming the outer leads in a single operation so that the chip and its leads are ready to be bonded on a substrate or to be packaged is well known in the art. For instance, U.S. Pat. No. 4,064,917 to Diaz discloses a punch and I.C. chip mount on a punch press. The punch has cutting edges which press in conjunction with the die mount's cutting edges to sever the chip and its outer leads from a lead frame. The punch also has forming edges which press in conjunction with the forming edges of a die form block to bend the outer leads to a desired configuration. Additionally, alignment pins are provided which engage sprocket holes of a film segment in order to accurately position the film segment, the lead frame attached to the film segment, and a chip bonded to the inner portion of the frame relative to the die mount and die form block. Nevertheless, the use of pins that engage sprocket holes in the tape fails to provide alignment between the punch and die form block (i.e. lead form anvil). What is needed is a direct mechanical alignment link between the punch and lead form anvil. The solution to aligning the punch and lead form anvil is not as simple as engaging alignment pins through holes due to severe space limitations. Such alignment pins may need to fit inside a window closely shaped to the perimeter of the punch without lying directly beneath the chip or its outer leads. Generally the only available space would be in the corners between outer leads on adjacent sides of the chips. A punch wall thickness from cutting edge to forming edge of, for example, 0.030 inches, would require pins with such small diameters that the pins would probably be subject to bending, breakage, or other reliability problems. The space limitation problem is further compounded by the increasing miniaturization of TAB microelectronic components.

The prior art has the shortcoming that in order to align the excise and lead form tooling, it is necessary to perform the alignment manually by trial and error. A typical manual alignment procedure is performed by first loosely fitting the lead form anvil mounting screws, aligning the lead form anvil with the punch by hand, and tightening the screws. An experimental component is then lead formed and examined under a microscope. Invariably the leads will be improperly bent due to a slight misalignment between the punch and lead form anvil. It then becomes necessary to loosen the lead form anvil mounting screws and try again. This method of adjustment tends to be an unsystematic trial and error procedure, and a skilled technician will usually require at least 8 hours and often about 30 hours to properly complete the alignment since there is no direct mechanical link between the punch and the lead form anvil. Furthermore, it is often critical to maintain alignment during usage. Since all of the alignment devices are floating relative to the punch and lead form anvil, this allows a large tolerance stack up to occur. Misalignment becomes acute during TAB tape manufacturing due to the fact that very small inaccuracies, for example 0.001 inches, can cause unacceptable lead forms. Furthermore, as it becomes necessary to replace the punch or lead form anvil to comply with components having different dimensional specifications, the trial and error alignment procedure will once again be necessary.

From the foregoing several things can be understood by those persons skilled in the art. First, it is clear that punch and lead form anvil alignment is a difficult and time consuming process that must be performed during set-up as well as maintained during usage. Second, the prior art has failed to disclose or suggest a simple and convenient solution to this alignment problem.

SUMMARY

The present invention provides a method and apparatus for quickly and conveniently aligning as well as maintaining alignment between a pair of mating tools, wherein a plurality of alignment members upwardly extending from one mating tool are positioned to engage in slidable contact with alignment tracks formed in the sides of a second mating tool.

An object of the present invention is wherein the first mating tool is a punch and the second mating tool is a lead form anvil.

A further object of the present invention is wherein the member to be lead formed is an I.C. bonded to a TAB tape.

Yet a further object of the present invention is wherein alignment rods extend from the four corners of a first rectangular mating tool and alignment tracks contain arcs of approximately ninety degrees are formed in the four corners of the second mating tool.

A still further object of the present invention is wherein the tops of the alignment rods are dome shaped.

A further object of the present invention is wherein the alignment rods are dowel pins.

Still a further object of the present invention is wherein the I.C. is also excised from a section of the TAB tape prior to lead forming.

Other and further objects, features, and advantages of the present invention will be apparent from the following description of the presently preferred embodiments of the invention, given for the purpose of disclosure, and taken in conjunction with the accompanying drawings.

BRIEF DESCRIPTION OF THE DRAWINGS

FIG. 4 is an exploded perspective view similar to FIG. 2 showing the inclusion of a pin plate for aligning the tape carrying an I.C. chip and an excise blade for cutting the I.C. chip and its outer leads from the tape, with both the pin plate and excise blade positioned between the punch and lead form anvil, FIG. 5 is an enlarged fragmentary cross-sectional view of the present invention with the punch in a retracted position showing the relation of the punch, tape, pin plate, excise blade and lead form anvil, FIG. 5A is a plan view taken across line 5A—5A of FIG. 5 showing an I.C. chip and its outer leads mounted on a tape, FIG. 6 is similar to FIG. 5 showing the punch in a partially retracted position and the I.C. chip and its outer leads cut from the tape by the excise blade, FIG. 6A is a plan view taken across line 6A—6A of FIG. 6 showing the I.C. chip and its outer leads cut from the tape, FIG. 7 is similar to FIG. 5 showing the punch at its downward position at the completion of cutting and forming the outer leads of the I.C. chip, FIG. 7A is a plan view taken along line 7A—7A of FIG. 7 showing the tape from which the I.C. chip and its outer leads have been cut out.

DESCRIPTION OF THE PREFERRED EMBODIMENT

The use of precise mating tools requires alignment of the tools during set-up as well as maintenance of the alignment. In the case of lead forming for microelectronic devices, very fine alignment tolerances are demanded. Additionally, the punches used for lead forming in microelectronic applications generally have very limited space in which a means for alignment can be placed. A technique that addresses this need in a fast and convenient manner is the use of alignment members positioned on a first mating tool to slidably engage alignment tracks formed in the exterior sides of a second mating tool. While the particular illustration will describe a punch and lead form anvil as the mating tools for forming the outer leads of an I.C. chip mounted on a TAB tape, the use of alignment rods which slidably engage tracks formed in the exterior of the other mating tool can be incorporated in a wide variety of applications.

Figure 1:
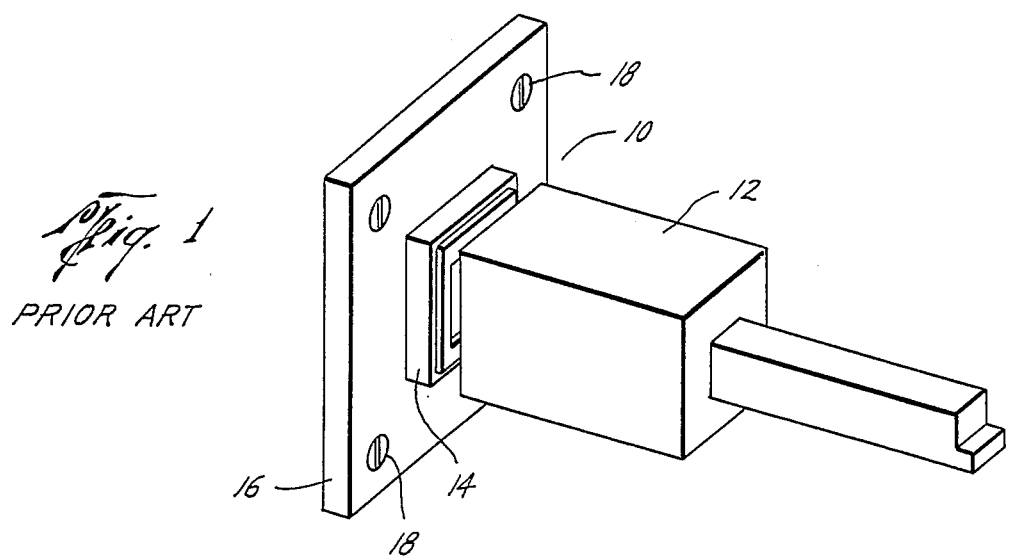
FIG. 1 is a perspective view of a prior art punch and lead form anvil without a direct mechanical link for alignment between the punch and the lead form anvil.

Referring now to FIG. 1, a conventional punch and lead form anvil system 10 is shown. Punch 12 and lead form anvil 14 are tools to be mated as lead forming occurs. Lead form anvil 14 is mounted on base 16 and aligned with punch 12 by loosening lead form mounting screws 18, positioning base 16 by hand to the location base 16 appears to belong, and then tightening screws 18 to removably secure base 16. The numerous drawbacks of this method have been previously described.

Figure 2:
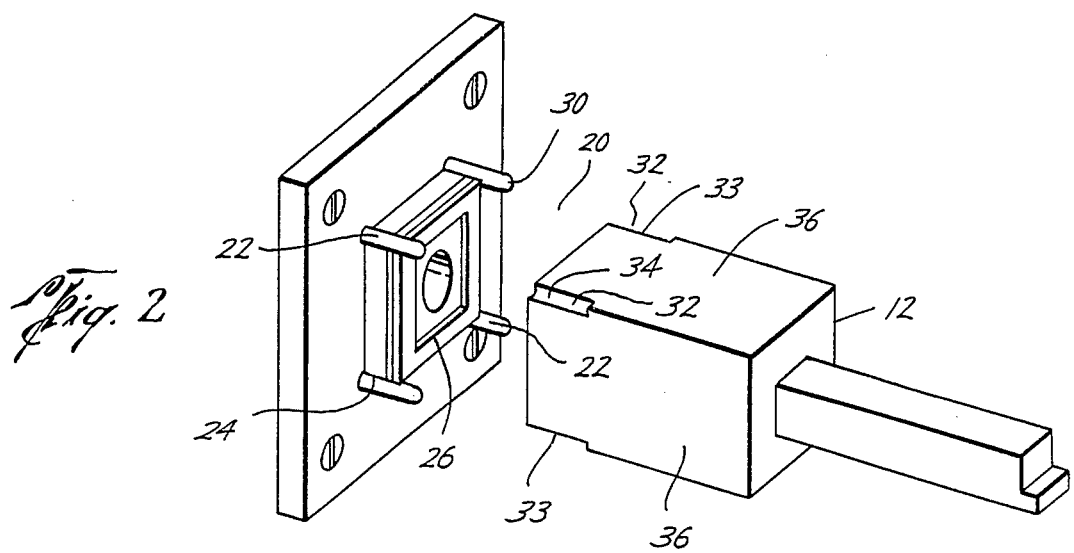
FIG. 2 is a perspective view of the present invention showing alignment rods in the corners of the lead form anvil and alignment tracks in the corners of the punch with the punch in a retracted position.
Figure 8:
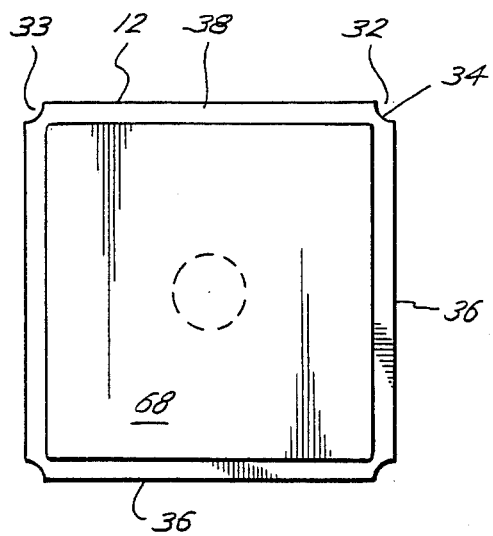
FIG. 8 is an exploded detailed plan view of the bottom surface of the punch taken along line 8—8 of FIG. 5 showing the alignment tracks positioned in the corners.
Figure 9:
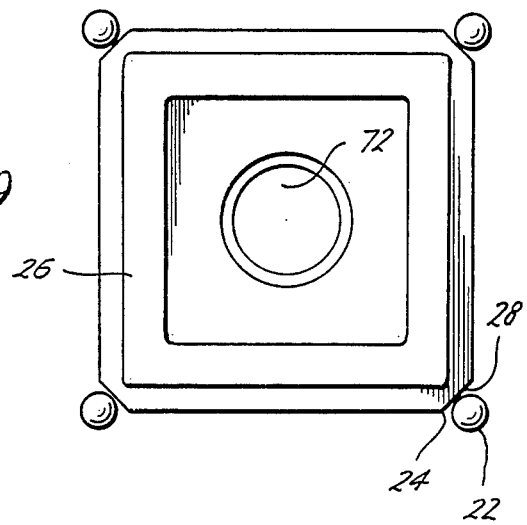
FIG. 9 is an exploded detailed plan view of the top surface of the lead form anvil taken along line 9—9 of FIG. 9 showing the alignment rods positioned in the corners.

Referring now to FIGS. 2, 8 and 9, one embodiment of the present invention is shown by lead forming system 20. Alignment rods 22 are positioned in the corners 24 of lead form anvil 14. Though shown in all four corners, rods 22 could instead be placed only in diametrically opposite corners. The rods 22 extend above top surface 26 of lead form anvil 14 in the direction of punch 12. Chamfers 28 are cut in corners 24 of lead form anvil 14 so that rods 22 are partially within corners 24. Rods 22 can be securely positioned within corners 24 by placing rods 22 inside insertion holes (not shown) in base 16 to form an interference fit, that is, in which prior to insertion the diameters of rods 22 are slightly larger than the diameters of the insertion holes. Thereafter the rods 22 will be securely fastened to base 16 and positioned adjacent corners 24. Rods 22 can be cylindrically shaped with dome shaped tops 30. Rods 22 are preferably constructed of the same material as the punch 12 and lead form anvil 14, such as steel, in order to improve reliability by matching such characteristics as wear resistance and thermal coefficient of expansion. For example, rods 22 can be cylindrically shaped steel dowel pins with dome shaped tops having a 0.0630 inch diameter and extending 0.120 inches above the lead form anvil top surface 26.

Punch 12 contains alignment tracks 32 formed in the punch corners 33 in a direction normal to the movement of punch 12 to provide slidable engagement with rods 22. Tracks 32 contain a curved interior 34 matched to the exterior curvature of rods 22 to provide a secure yet slidably engaging transition fit. This can be accomplished by having roughly the same diameters on tracks 32 and rods 22. Preferably the track interiors 34 will form a 90 degree arc parallel to the direction of movement of punch 12. For example, having four rods 22 slidably engage four tracks 32 with 90 degree arc interiors 34 will provide 360 degrees of direct mechanical surface contact linkage between punch 12 and lead form anvil 14. Tracks 32 are formed on punch surfaces 36 lying adjacent and perpendicular to punch bottom surface 38, and tracks 32 begin on the bottom of surfaces 36 that intersect bottom surface 38 and extend upwards in the same direction as rods 22. Punch bottom surface 38 and lead form anvil top surface 26 are preferably coacting rectangular planar surfaces of similar dimensions and positioned so that track interiors 34 are positioned directly above the outside surfaces of rods 22 adjacent chamfers 28. While alignment tracks 32 can be formed by merely boring corners 33 of punch 12, the preferred method is by jig grinding holes in corners 33 of oversized punch surfaces 36, and then planarly grinding down punch surfaces 36 to proper size so that tracks 32 are formed.

Figure 3:
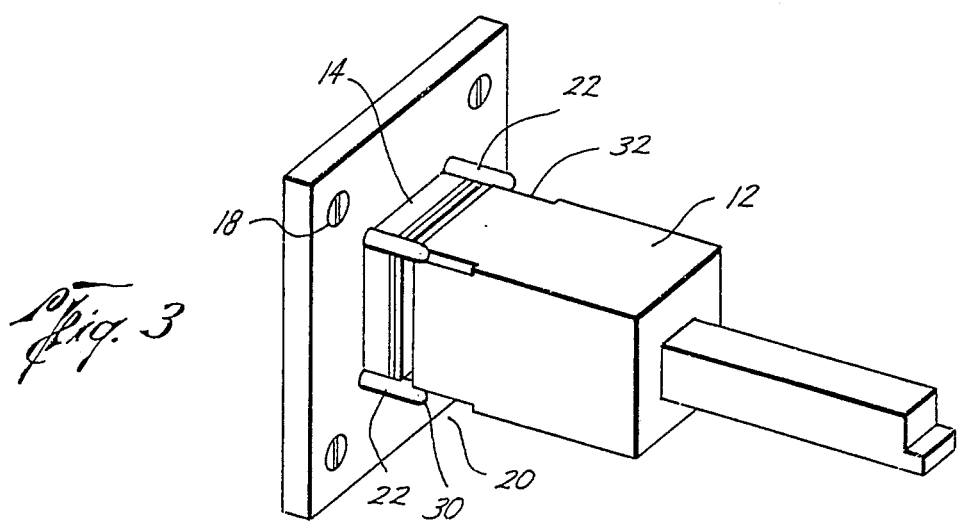
FIG. 3 is similar to FIG. 2 showing the punch at its downward position near the completion of forming the outer leads of an I.C. chip wherein the rods slidably engage the tracks to align the punch and the lead form anvil.

Referring now to FIG. 3, it is seen that as punch 12 is drawn downwardly towards lead form anvil 14 the alignment rods 22 slidably engage tracks 32 in the corners of punch 12, thereby aligning punch 12 with lead form anvil 14. Alignment during tooling set-up can be provided by loosening lead form anvil mounting screws 18 when punch 12 is retracted, positioning punch 12 downwardly near lead form anvil 14 so that rods 22 engage tracks 32, and tightening screws 18. Moreover, as lead forming system 20 is put into operation rods 22 will continue to engage tracks 32 and thus contribute to maintaining alignment while offering no significant mechanical resistance to the motion of punch 12. The dome tops 30 on rods 22 assure a smooth initial engagement with tracks 32.

Referring now to FIGS. 4, 5A, 6A and 7A, optional pin plate 40 and excise blade 42 can be positioned between punch 12 and lead form anvil 14, if desired, so that TAB tape 44 can be excised prior to lead forming. Pin plate 40 serves as a means of aligning TAB tape 44 within lead forming system 20. Tape alignment pins 46 in pin plate 40 can be alignment marks for sprocket holes 48 in TAB tape 44. Numerous other means for aligning a TAB tape are well known to those having skill in the art, for instance, by placing holes, edge outlines, or instances notches in the TAB tape, as well as various other optical fiduciary marks such as bulls-eye patterns, cross patterns, or metallization traces. TAB tape alignment can also be accomplished by various optical image processing systems or energy sensig systems known to those having skill in the art. After TAB tape 44 is aligned, excise blade 42 can be used to cut interior TAB tape section 52, comprising I.C. chip 54 and its outer leads 56, from exterior TAB tape section 58. TAB tape 44 is sliced along tape edges 60 by cutting edges 62 of excise blade 42 as punch 12 is actuated downwardly. Nevertheless, lead forming can be performed without excise blade 42, such as by blind forming whereby tape edges 60 are pre-cut prior to leading TAB tape 44 into lead form system 20.

It is seen that corners 64 of interior section 52 are the primary locations available for tooling alignment means on punch 12, since the alignment means must not interfere with I.C. chip 54 or its outer leads 56. Since punch 12 must fit through excise window 66 with cutting edges 62 having the same length and width as tape edges 60, the area for punch 12 alignment means within corners 64 is constrained by tape edges 60 and the nearest two outer leads 56. If, as a typical example, the punch wall thickness is 0.030 inches, this would require an alignment hole with reasonably strong edge strength to be drilled in corner 64 with a diameter no larger than approximately 0.010 inches. Such a small hole would require very small diameter alignment pins that in usage would be quite likely to bend or break. The present invention overcomes this limitation by forming alignment tracks 32 on punch 12 in the space provided by corners 64 on tape 44 that can accommodate larger alignment rods 22 than that would otherwise be possible by drilling holes in punch 12.

Figure 10:
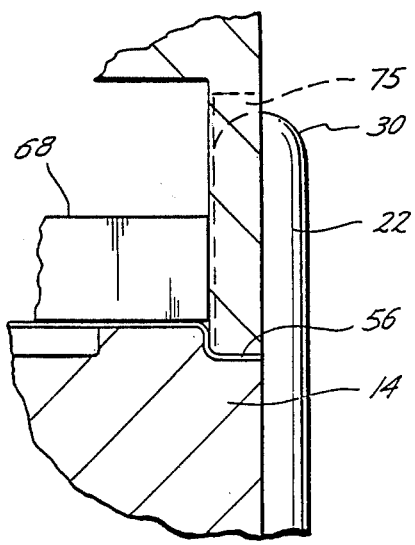
FIG. 10 is an exploded detailed cross-sectional view taken from area 10 of FIG. 7 showing an alignment rod slidably engaging an alignment track.

The overall excise and lead forming operation with the aligned tooling is now described. Referring to FIG. 5, TAB tape 44 is fed into position by whatever means are desired, such as reel-to-reel means or slide carrier means. Pin plate 40 is then lowered and pins 46 locate TAB tape sprocket holes 48 to align TAB tape 44 with the tooling. Referring now to FIG. 6, Punch 12 is actuated in any suitable manner and drawn downwardly into contact with TAB tape 44. Plunger 68 on the punch bottom surface 38, as best seen in FIG. 8, is aided by a downward pressure from plunger spring 70 and presses down against I.C. chip 54. Vacuum pipette 72 on lead form anvil top surface 26, as best seen in FIG. 9, is then raised by shaft 74 and fastens to the bottom of interior TAB tape section 52 by applying a vacuum suction pressure in order to hold interior section 52 in place. As punch 12 continues moving downwardly, TAB tape 44 is pressed along tape edges 60 against cutting edges 62 surrounding window 66 of excise blade 42 and tape interior section 52 separates from tape exterior section 58. Referring to FIG. 7, as punch 12 continues to descend, tape interior section 52 is clamped between punch plunger 68, aided by spring 70, and vacuum pipette 72 on now descending shaft 74. At this point alignment rods 22 slidably engage alignment tracks 32, thereby maintaining the precise alignment between punch 12 and lead form anvil 14, without creating significant mechanical resistance to the movement of punch 12. Punch 12 will continue to descend as the bottom of interior tape section 52 presses against lead form anvil top surface 26. At this point, as best seen in FIG. 10, punch plunger 68 is held stationary as plunger spring 70 compresses, thereby sandwiching I.C. chip 54 between punch plunger 68 and lead form anvil top surface 26. The punch perimeter section 75, which contains tracks 32, continues to move downward and presses outer leads 56 against lead form anvil 14 until lead forming is complete. Punch 12 then retracts upwardly and releases contact with I.C. chip 54, and base 16 can be rotated ninety degrees by lead form anvil rotation means 76 so that I.C. chip 54 can be removed from vacuum pipette 72 by any suitable means, including by hand with vacuum tweezers, or by robotic or manual vacuum manipulators. Lead form anvil rotation means 76 then returns base 16 to the original position and the excise and lead form operation is ready to be repeated.

The present invention, therefore, is well adapted to carry out the objects and attain the ends and advantages mentioned as well as others inherent therein. While a presently preferred embodiment of the invention has been given for the purposes of disclosure, numerous changes in the details of construction, arrangement of parts, and steps of the process will be readily apparent to those skilled in the art and which are encompassed in the spirit of the invention and the scope of the appended claims.

What is claimed is:

1. A tooling alignment apparatus comprising:
   first and second mating tools,
   the first tool comprising a plurality of alignment tracks formed in the exterior sides in the direction normal to the movement between the tools, and
   the second tool comprising a plurality of alignment members extending upwardly towards the first tool and positioned directly beneath the alignment tracks, wherein the alignment members are formed to engage in slidable contact with the alignment tracks as the tools are brought together.

2. The apparatus of claim 1 wherein the first mating tool is a punch.

3. The apparatus of claim 1 wherein the second mating tool is a lead form anvil.

4. The apparatus of claim 1 wherein the alignment members are located in diametrically opposite corners of the mating surface on the second tool and the alignment tracks are located in the corners of the mating surface on the first tool.

5. The apparatus of claim 4 wherein the alignment members are four alignment rods and each rod is positioned in a separate corner on the second tool and four corresponding tracks are located in the corners of the first tool.

6. The apparatus of claim 5 wherein the four alignment tracks in the corners of the first tool contain arcs of approximately ninety degrees.

7. The apparatus of claim 1 wherein the alignment members are cylindrically shaped.

8. The apparatus of claim 7 wherein the tops of the cylindrical alignment members are dome shaped.

9. The apparatus of claim 8 wherein the cylindrical alignment members are composed of the same material as the punch.

10. A tooling alignment apparatus comprising:
    a punch comprising a plurality of alignment tracks formed in the surface adjacent to the bottom surface of the punch and extending from the bottom surface of the punch upwardly in the direction of movement of the punch, and a lead form anvil comprising a plurality of alignment rods extending upwardly, wherein the alignment rods contain the same curvature as the tracks and the alignment rods are positioned to engage in slidable contact with the tracks as the punch moves towards the lead form anvil.

11. The apparatus of claim 10 wherein the rods and tracks are formed in diametrically opposite corners of the lead form anvil and punch.

12. The apparatus of claim 11 wherein the rods are located in four corners of the lead form anvil and the tracks are located in four corners of the punch.

13. The apparatus of claim 12 further comprising means for aligning a tape automated bonded component with the tooling.

14. The apparatus in claim 13 further comprising means for excising the component to be lead formed from a section of the tape.

15. In a punch and lead form anvil apparatus, with a rectangular lower punch surface designed to coact with a rectangular upper lead form anvil surface, for forming the outer leads of an electronic component mounted on a tape automated bonding tape wherein the improvement comprises:

alignment tracks with curved interiors formed in the corners of the punch extending upwards in the punch sides from the punch lower surface, and alignment rods with domed tops positioned in the corners of the lead form anvil upper surface and extending above the surface, wherein the alignment rods are curved to correspond to the curvature of the tracks, and the alignment rods are positioned to slidably engage the alignment tracks as the punch and lead form anvil are brought together so that the punch and lead form anvil are aligned.

16. A method for aligning two mating tools comprising:

positioning a first mating tool above a second mating tool wherein the first mating tool contains a plurality of alignment tracks formed in the exterior sides in the direction normal to the movement between the tools, and wherein the second mating tool contains a plurality of alignment members extending upwardly towards the first tool, the alignment members being shaped and positioned to engage in slidable conntact with the alignment tracks, and moving the alignment tools towards each other so that the alignment members slidably engage the alignment tracks and thereby align the mating tools.

17. A method of aligning a punch and lead form anvil comprising:

positioning a punch above a lead form anvil, wherein a plurality of alignment tracks formed in the punch exterior surfaces adjacent the bottom surface of the punch extend upwardly from the bottom surface in a direction normal to the movement between the punch and lead form anvil, and wherein a plurality of alignment rods placed directly beneath the alignment tracks extend upwardly from the lead form anvil and are shaped so that the alignment rods will slidably engage the alignment tracks as the punch and lead form anvil are brought together, and moving the punch and lead form anvil together so that the alignment rods slidably engage the alignment tracks and the punch and lead form anvil are thereby aligned.

18. The method of claim 17 wherein the alignment rods are positioned in the corners of the lead form anvil and the alignment tracks are located in the corners of the punch.

19. The method of claim 18 wherein the alignment rods are cylindrically shaped with domed tops and the interior of the alignment tracks form a 90 degree arc parallel to the direction of movement between the punch and lead form anvil.

20. A method of aligning a punch and lead form anvil with rectangular coacting surfaces for forming the outer leads of an electronic component mounted on a tape comprising:

positioning the punch above the lead form anvil so that tracks with curved interiors formed in the four corners of the punch and extending upwards from the punch coacting surface are positioned directly above cylindrical rods having the same diameter as the curved interiors of the tracks and having domed tops, wherein the rods are located in the corners of the lead form anvil and positioned to engage in smooth slidable contact with the alignment tracks on the punch as the punch is brought towards the lead form anvil, and actuating the punch towards the lead form anvil so that the rods slidably engage the tracks while creating no significant mechanical resistance to the movement of the punch so that the punch and lead form anvil will be aligned.

* * * * *

UNITED STATES PATENT AND TRADEMARK OFFICE
CERTIFICATE OF CORRECTION

PATENT NO. : 4,945,954
DATED : 08/07/90
INVENTOR(S) : WEHRLY ET AL

It is certified that error appears in the above—identified patent and that said Letters Patent is hereby corrected as shown below:

Column 3, line 28, change "FIG. 9" to -- FIG. 5 --.

Column 5, line 5, change "instances" to -- instance --.

Column 5, line 9, change "sensig" to -- sensing --.

Column 6, line 67, change "surface" to -- surfaces --.

Column 7, line 48, change "conntact" to -- contact --.

Signed and Sealed this

Twenty-eighth Day of April, 1992

*Attest:*

HARRY F. MANBECK, JR.

*Attesting Officer*     *Commissioner of Patents and Trademarks*